US005614055A

United States Patent [19]
Fairbairn et al.

[11] Patent Number: 5,614,055
[45] Date of Patent: Mar. 25, 1997

[54] HIGH DENSITY PLASMA CVD AND ETCHING REACTOR

[75] Inventors: Kevin Fairbairn, Saratoga; Romuald Nowak, Cupertino, both of Calif.

[73] Assignee: Applied Materials, Inc., Santa Clara, Calif.

[21] Appl. No.: 113,776

[22] Filed: Aug. 27, 1993

[51] Int. Cl.$^6$ ............................. C23F 1/02; C23C 16/00; C23C 14/34; H05H 1/24

[52] U.S. Cl. .................... 156/345; 118/723 E; 118/723 I; 118/723 IR; 118/723 AN; 204/298.31; 204/298.33; 204/298.34; 204/298.37; 156/643.1; 216/68; 216/70; 216/71; 427/569; 427/585; 427/574

[58] Field of Search ........................ 156/345, 643, 156/643.1; 204/192.32, 298.31, 298.33, 298.34, 298.37, 298.39; 118/715, 723 R, 723 MP, 723 MW, 723 ME, 723 MR, 723 MA, 723 AN, 723 E, 723 I, 723 IR; 427/569, 571, 585, 598, 574; 216/68, 71, 70

[56] References Cited

U.S. PATENT DOCUMENTS

| | | |
|---|---|---|
| 4,795,529 | 1/1989 | Kawasaki et al. . |
| 4,842,683 | 6/1989 | Cheng et al. . |
| 4,844,775 | 7/1989 | Keeble ................................ 156/643 |
| 4,872,947 | 10/1989 | Wang et al. . |
| 4,943,361 | 7/1990 | Kakehi et al. .................. 204/192.32 |
| 4,948,458 | 8/1990 | Ogle ................................ 156/345 |
| 4,992,665 | 2/1991 | Mohl ................................ 250/423 R |
| 5,006,192 | 4/1991 | Deguchi ............................. 156/345 |
| 5,122,251 | 6/1992 | Campbell et al. ............... 204/298.31 |
| 5,156,703 | 10/1992 | Oechsner ............................ 156/345 |
| 5,231,334 | 7/1993 | Paranjpe ........................ 204/298.31 |
| 5,234,529 | 8/1993 | Johnson ............................ 156/345 |
| 5,277,751 | 1/1994 | Ogle ............................. 204/298.34 |
| 5,280,154 | 1/1994 | Cuomo et al. . |
| 5,286,297 | 2/1994 | Moslehi et al. .................... 118/723 E |
| 5,286,331 | 2/1994 | Chen et al. ......................... 156/345 |
| 5,290,993 | 3/1994 | Kaji et al. .......................... 156/345 |
| 5,346,578 | 9/1994 | Benzing et al. .................... 156/345 |
| 5,368,710 | 11/1994 | Chen et al. . |
| 5,401,350 | 3/1995 | Patrick et al. ................... 118/723 I |

FOREIGN PATENT DOCUMENTS

| | | |
|---|---|---|
| 0379828A3 | 8/1990 | European Pat. Off. . |
| 0379828A2 | 8/1990 | European Pat. Off. . |
| 520519A1 | 6/1992 | European Pat. Off. . |
| 0520519 | 12/1992 | European Pat. Off. . |
| 0552491A1 | 7/1993 | European Pat. Off. . |
| 0596551A1 | 5/1994 | European Pat. Off. . |
| 05/146628 | 6/1993 | Japan . |
| 2231197 | 11/1990 | United Kingdom . |
| WO91/17285 | 11/1991 | WIPO . |
| WO9220833 | 11/1992 | WIPO ........................ C23C 16/00 |

Primary Examiner—R. Bruce Breneman
Assistant Examiner—Rodney G. McDonald
Attorney, Agent, or Firm—Michaelson & Wallace

[57] ABSTRACT

In one aspect, the invention is embodied in an RF inductively coupled plasma reactor including a vacuum chamber for processing a wafer, one or more gas sources for introducing into the chamber reactant gases, and an antenna capable of radiating RF energy into the chamber to generate a plasma therein by inductive coupling, the antenna lying in a two-dimensionally curved surface. In another aspect, invention is embodied in a plasma reactor including apparatus for spraying a reactant gas at a supersonic velocity toward the portion of the chamber overlying the wafer. In a still further aspect, the invention is embodied in a plasma reactor including a planar spray showerhead for spraying a reactant gas into the portion of the chamber overlying the wafer with plural spray nozzle openings facing the wafer, and plural magnets in an interior portion of the planar spray nozzle between adjacent ones of the plural nozzle openings, the plural magnets being oriented so as to repel ions from the spray nozzle openings. In yet another aspect, the invention is embodied in a plasma reactor including a conductive dome-shaped electrode overlying the wafer and being connectable to an electrical potential. In a still further aspect, the invention is embodied in a plasma process, including the steps of providing a vacuum processing chamber having a dome-shaped antenna, feeding a processing gas including an electronegative gas into the chamber, resonantly coupling an RF electrical signal to the antenna, and non-resonantly and inductively coupling electromagnetic energy from the antenna into a plasma formed in the processing chamber from the processing gas.

52 Claims, 9 Drawing Sheets

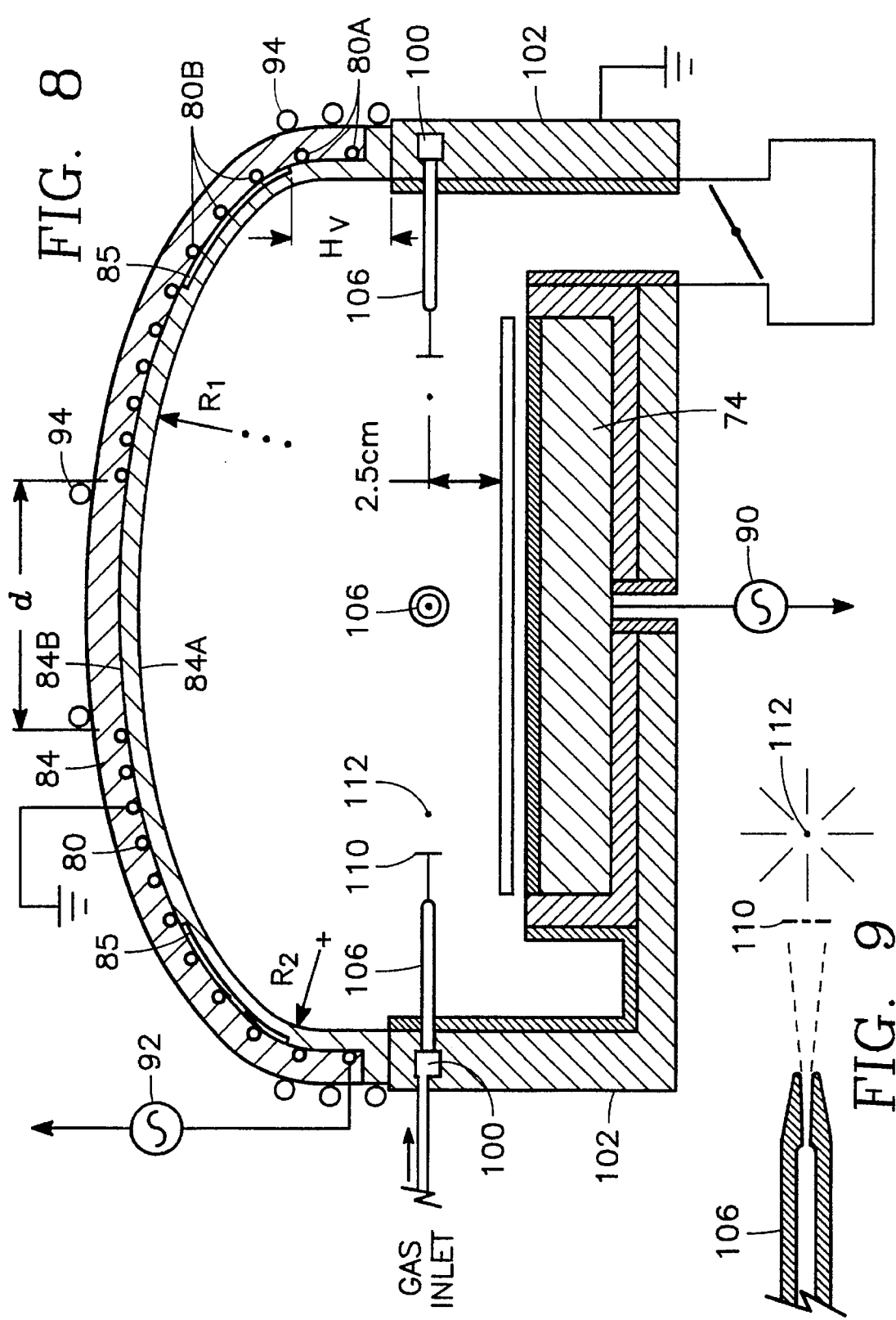

HIGH DENSITY PLASMA CVD AND ETCHING REACTOR

BACKGROUND OF THE INVENTION

1. Technical Field

The invention relates to reactors for performing radio frequency (RF) plasma chemical vapor deposition (CVD) and sputter etch processes and particularly to such reactors for performing both processes simultaneously.

2. Background Art

CVD formation of a thin silicon dioxide film on an integrated circuit structure having small (0.5 µm or less) features with high aspect ratios (i.e., a large value of the ratio of channel depth to channel width, e.g., greater than two) is nearly impossible to accomplish without formation of voids between the metal lines. As shown in FIG. 1A, in depositing a dielectric material 10 on a device having a very narrow channel 12 (i.e., an aspect ratio greater than 2) separating two metal lines 14a, 14b, relatively little of the dielectric material 10 reaches the bottom of the channel 12, leaving a void 15. This is because dielectric material 10 is deposited more quickly at the corners 16 of the metal lines 14 than elsewhere along the vertical walls of the metal lines 14, thus at least nearly sealing off the bottom of the channel 12 during the deposition process. A solution to this problem is to simultaneously etch the dielectric material 10 from the corners while depositing using an RF sputter etch process that uses ions impinging vertically on the surface, thus preventing pinching off of the channel 12. This process can be used for spaces with aspect ratios greater than two, unlike currently-used sequential deposition and sputtering which fails below 0.5 µm.

As illustrated in the graph of FIG. 1B, an RF sputter etch process has a maximum etch rate for surfaces disposed at a 45° angle relative to the incoming ions. By directing the ions to impinge in a perpendicular direction relative to the wafer surface, the sputter etch process quickly etches angled surfaces formed by the simultaneous deposition process (such as dielectric surfaces formed over the corners 16) and etches other surfaces (i.e., horizontal and vertical surfaces) much more slowly, thus preventing the blockage of the channel 12 and formation of the void 15 shown in FIG. 1A. This permits deposition of dielectric material preferentially at the bottom of the channel 12 and on top of the lines 14, relative to the side walls and corners 16, as illustrated in FIG. 1C.

In order to accomplish the foregoing, the RF plasma sputter etch rate near the corners 16 must be on the order of the deposition rate. High plasma density is required to meet the requirement of high sputtering rate (production throughput) without electrical damage to the semiconductor devices. In order to achieve such a sputter etch rate across an entire wafer (such as an eight inch Silicon wafer), the plasma ion density must be sufficiently high and uniform across the entire wafer. Such uniformity is readily accomplished using a plasma consisting almost entirely of argon ions. However, it will be remembered that the sputter etch process desired here is ancillary to a CVD process requiring species other than argon to be present. Specifically, in a CVD process employing silane ($SiH_4$) in which the dielectric material 10 is $SiO_2$, oxygen must be present in significant quantities, the oxygen being ionized in the plasma. The oxygen ions have a relatively short lifetime and are highly susceptible to quenching. It is very difficult to attain a dense and very uniform distribution of oxygen ions across the wafer surface, particularly 8-inch diameter wafers of the type now currently in use.

While the plasma may be generated with electron cyclotron resonance (ECR), ECR apparatus has limited commercial attractiveness due to design complexity, size and cost. Moreover, since the plasma is generated remotely from the wafer, scaling the ECR reactor up to accommodate an 8-inch wafer diameter is difficult and requires simultaneous use of complex magnetic fields.

Application of inductively coupled plasmas to high-rate sputter etching in CVD systems is disclosed in application Ser. No. 07/941,507 filed Sep. 8, 1992 by Collins et al. entitled "Plasma Reactor Using Electromagnetic RF Coupling and Processes" and assigned to the assignee of the present application, the disclosure of which is hereby incorporated by reference in its entirety into the present specification. An earlier version of this work is described in European patent publication EP 0,520,519 A1. As described therein, one advantage of inductively coupled plasmas over capacitively coupled plasmas is that the inductively coupled plasma is generated with a much smaller bias voltage on the wafer (reducing the likelihood of damage thereto) even in the presence of a greater plasma density. In the silicon oxide deposition disclosed in the referenced patent application, silane, mostly un-ionized, provides the silicon and a gaseous oxygen species provides the oxygen for the formation of silicon dioxide by CVD. Argon ions accelerated across the sheath adjacent the wafer are used for sputter etching.

FIG. 2 illustrates a CVD vacuum chamber 20 and RF antenna 22 for generating an inductively coupled plasma of the general type disclosed in the above-referenced application, although that particular chamber had a top-hat shape. The RF antenna 22 is a coiled conductor wound as a solenoid around the cylindrical vertical side wall 24 of the vacuum chamber 20. The source chamber wall adjacent the coil antenna is an insulator while the ceiling 26 and the process chamber walls are preferably grounded, the flat ceiling 26 functioning as a grounded electrode.

The cylindrical coil of the referenced application non-resonantly couples the RF energy in the coil antenna into the plasma source region via an induced azimuthal electric field. Even in free space, the electric field falls to zero at the center of the chamber. When a plasma is present, the electric field falls off even more quickly away from the chamber walls. The electric field accelerates electrons present in the plasma, which then further ionize atoms into ions or break up molecules into atoms or radicals. Because the coupling is not tuned to a plasma resonance, the coupling is much less dependent on frequency, pressure and local geometries. The plasma source region is designed to be spaced apart from the wafers, and the ions and atoms or radicals generated in the source region diffuse to the wafer.

The chamber of the above-referenced application is primarily designed for etching at relatively low chamber pressures, at which the electrons have mean free paths on the order of centimeters. Therefore, we believe the electrons, even though primarily generated near the chamber walls, diffuse toward the center and tend to homogenize the plasma across a significant diameter of the source region. As a result, the diffusion of ions and atoms or radicals to the wafer tend to be relatively uniform across the wafer.

We believe the reactor of the above-referenced application has a problem when it is used for CVD deposition and sputter etching, particularly involving oxygen. For CVD, the chamber pressure tends to be somewhat higher, reducing the electron mean free path and resulting in a nonuniform plasma density with the peak density occurring in an outer annulus of the plasma. Furthermore, oxygen ions or radicals are subject to many recombination paths so that their diffusion lengths are relatively limited. Thus, the wafer center is farther from the plasma source region than the wafer edges, and the oxygen ion and radical density is less near the center of the wafer 28 than it is at the edges thereof, as illustrated in the solid line curve of ion density of FIG. 3. The lack of oxygen ions near the wafer center reduces the sputter etch rate relative to the CVD deposition rate, leading to formation of the void 15 as illustrated in FIG. 1A in spaces or channels near the wafer center (e.g., the channel 12 of FIG. 1A), while spaces near the wafer periphery have the desired ratio between sputtering and deposition rates.

One possible solution would be to raise the height of the ceiling 26 and to increase the axial height of the antenna 22 above the wafer. (For argon only, the ion distribution for this taller source would be virtually uniform in accordance with the dashed-line curve of FIG. 3.) However, such a height increase is impractical because the larger volume makes cleaning of the system more difficult. Another possible solution would be to operate the source region at a very low pressure (below 1 milliTorr), at which the oxygen ion density is quite uniform and ion distribution may not be as severe a problem, depending upon the distance of the wafer to the top electrode. However, maintaining such a hard vacuum requires an impractically large pump size, and so a relatively lower vacuum (higher pressure) between 1 and 30 milliTorr is needed for commercial viability.

Some of these problems are addressed by Ogle in U.S. Pat. No. 4,948,458 by the use of a planar spiral coil antenna placed on a flat dielectric chamber top. This is sometimes called a pancake coil. Such a design is claimed to create a uniform plasma source region adjacent the top of the chamber, thus providing uniform ion and radical diffusion to the wafer.

However, we believe the pancake coil to have drawbacks. Its planar configuration suggests that a significant part of its RF power coupling into the chamber is capacitive coupling, that is, it uses electric fields set up by charge accumulation in the antenna structure rather than electric fields induced by current flow through the antenna, as is the case with inductive coupling. Capacitive coupling generally creates very high electric fields, which in turn create high-energy electrons that are deleterious in a semiconductor reactor. In contrast, the predominantly inductive coupling of the above-referenced application of Collins et al. produces lower electric fields and lower electron energies.

Accordingly, there is a need to uniformly distribute oxygen ions in high density inductively coupled plasmas between 1 and 30 milliTorr across large (8-inch) wafers in order to maintain uniform oxygen sputter or etch rates on the order of 1000 Angstroms per minute.

Another problem is that silane emitted from the gas outlets 30 in the sides of the vacuum chamber 20 diffuses equally in all directions, not just toward the wafer 28. Since the silane and oxygen gases react together spontaneously, and since the chamber walls are closer to the gas outlets 30 than most of the wafer 28 (particularly for larger diameter wafers), deposition of $SiO_2$ over all interior surfaces of the vacuum chamber 20 is greater than that on the wafer 28. This means that the reactor must be periodically removed from productive activity and the $SiO_2$ coating removed from the interior surfaces, a significant disadvantage.

Thus, there is a need for a reactor which deposits less CVD residue (e.g., $SiO_2$) on the interior chamber surfaces and which therefore requires less frequent cleaning.

SUMMARY OF THE DISCLOSURE

In accordance with one aspect, the invention is embodied in an RF inductively coupled plasma reactor including a vacuum chamber for processing a wafer, one or more gas sources for introducing into the chamber reactant gases, and an antenna capable of radiating RF energy into the chamber to generate a plasma therein by inductive coupling, the antenna lying in a two-dimensionally curved surface.

In accordance with another aspect, the invention is embodied in a plasma reactor including a vacuum chamber for processing a wafer, an antenna capable of radiating RF energy into the chamber to generate a plasma in a portion of the chamber overlying the wafer, and apparatus for spraying a reactant gas at a supersonic velocity toward the portion of the chamber overlying the wafer.

In accordance with a further aspect, the invention is embodied in a plasma reactor including a vacuum chamber for processing a wafer, an antenna capable of radiating RF energy into the chamber to generate a plasma in a portion of the chamber overlying the wafer, and a plurality of elongate spray nozzles thermally coupled to a vacuum containment wall of the vacuum chamber and extending toward the wafer with respective nozzle tips having gas distribution inlet orifices at least nearly overlying the edge of the wafer.

In accordance with yet another aspect, the invention is embodied in a plasma reactor including a vacuum chamber for processing a wafer, an antenna capable of radiating RF energy into the chamber to generate a plasma in a portion of the chamber overlying the wafer, and a closed tube inside the vacuum chamber for spraying a reactant gas into the portion of the chamber overlying the wafer and symmetrically disposed relative to the wafer and following an edge contour of the wafer so as to not overlie a substantial portion of the wafer, the closed tube having a plurality of spray openings therein facing an interior portion of the vacuum chamber overlying the wafer.

In accordance with a still further aspect, the invention is embodied in a plasma reactor including a vacuum chamber for processing a wafer, an antenna capable of radiating RF energy into the chamber to generate a plasma in a portion of the chamber overlying the wafer, a planar spray showerhead for spraying a reactant gas into the portion of the chamber overlying the wafer, the planar spray showerhead overlying an interior portion of the vacuum chamber over the wafer, the planar spray showerhead being parallel to and at least nearly co-extensive with the wafer and having plural spray nozzle openings facing the wafer, and plural magnets in an interior portion of the planar spray nozzle between adjacent ones of the plural nozzle openings, the plural magnets being oriented so as to repel ions from the spray nozzle openings.

In accordance with yet another aspect, the invention is embodied in a plasma reactor including a vacuum chamber for processing a wafer, an antenna capable of radiating RF energy into the chamber to generate a plasma, and a conductive dome-shaped electrode overlying the wafer and being connectable to an electrical potential.

In accordance with a still further aspect, the invention is embodied in a plasma process, including the steps of providing a vacuum processing chamber holding a workpiece to be processed and having a dome-shaped antenna on one side thereof, feeding a processing gas including an electronegative gas into the processing chamber, resonantly coupling an RF electrical signal to the antenna, and non-resonantly and inductively coupling electromagnetic energy from the antenna into a plasma formed in the processing chamber from the processing gas, whereby the workpiece is processed by the plasma.

BRIEF DESCRIPTION OF THE DRAWINGS

FIG. 8 is a cross-sectional elevational view of a fourth embodiment of the present invention employing an overhead dome-shaped RF antenna and a multiple-nozzle gas distribution apparatus.

FIG. 9 is a cross-sectional side view of a preferred nozzle shape employed in the embodiment of FIG. 7.

DETAILED DESCRIPTION OF THE PREFERRED EMBODIMENTS

Figure 4:
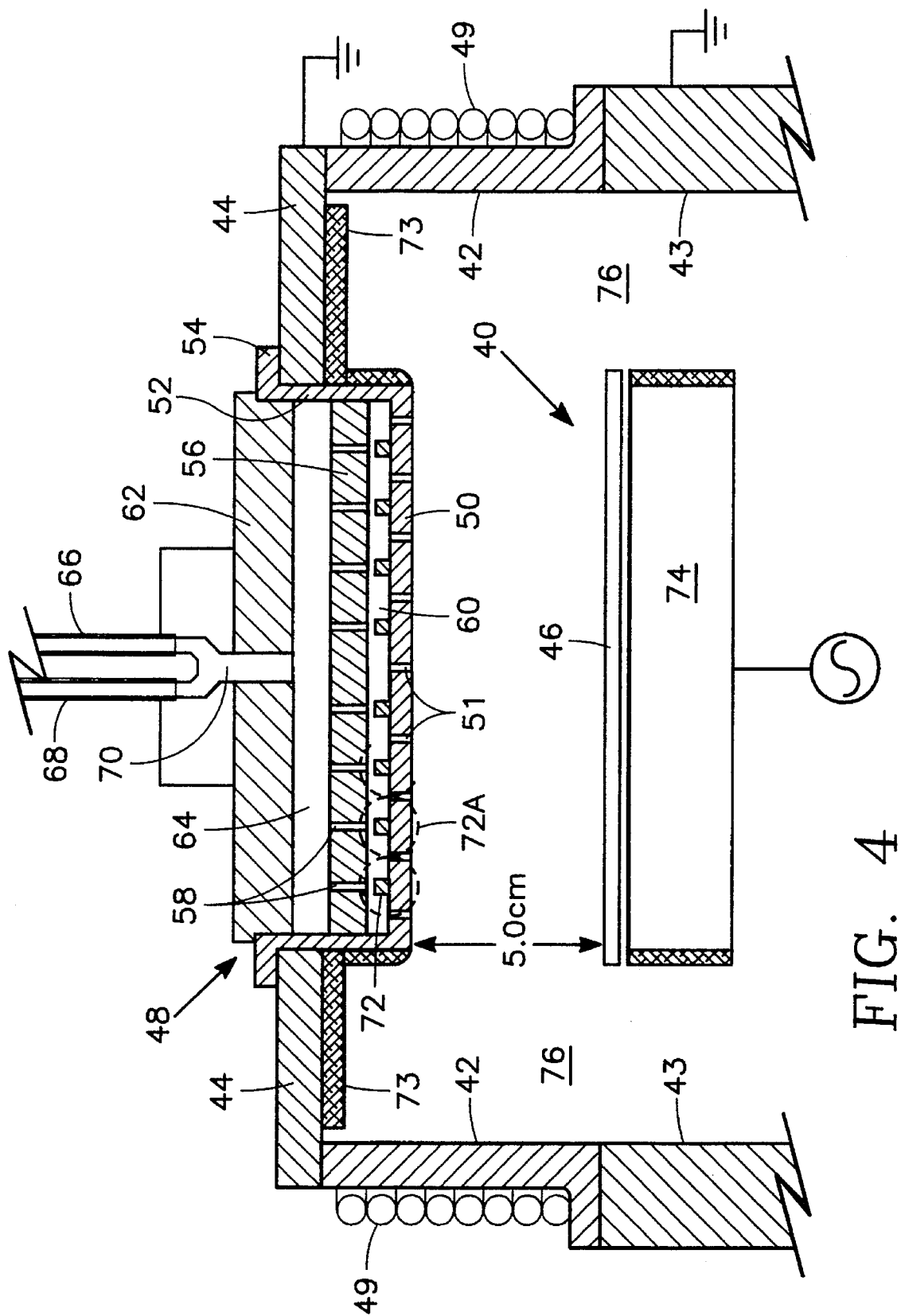
FIG. 4 is a cross-sectional elevational view of a first embodiment of the present invention employing a showerhead gas distribution apparatus.

Referring to FIG. 4, a first embodiment of an improved inductively coupled plasma CVD reactor concentrates the silane gas more on the wafer 40 and less on the interior vacuum chamber walls 42, 43, 44 by releasing the silane gas directly over and close to (within about 2 inches or 5 cm of) the wafer surface 46 by a showerhead 48 extending parallel to and across substantially the entire wafer diameter and disposed in an opening in the ceiling 44 of the vacuum chamber. In the illustrated embodiment, the wall 42 is a dielectric material while the wall 43 and ceiling 44 are electrically conductive materials. As in the apparatus of FIG. 2, the chamber walls 43, 44 are electrically grounded. A coiled RF antenna 49 extending from above the showerhead 48 to below the wafer 46 generates a plasma within the chamber by inductive coupling through the dielectric wall 42.

The showerhead 48 consists of a flat circular bottom wall 50 parallel to the wafer 40 and having many narrow vertical spray openings 51 therethrough. The showerhead 48 is integrally formed with a cylindrical wall 52 having a circular shoulder 54 resting on the top of the chamber ceiling 44. A circular intermediate wall 56 has narrow vertical spray openings 58 therethrough laterally interleaved with the spray openings 51 of the bottom wall 50. A spray chamber 60 is formed between the circular bottom and intermediate walls and the cylindrical side wall 52. A flat circular top wall 62 of the nozzle bounds a manifold 64 with the intermediate wall 56 and the side wall 52. A pair of external gas inlets 66, 68 connect to a mixing manifold 70 extending through the top wall 62 into the manifold 64. For silicon dioxide CVD, silane and oxygen are fed into the chamber through separate pipes. In order to confine the plasma away from the surface of the bottom nozzle wall 50, a set of discrete magnets 72 are distributed (in accordance with well-known plasma confining techniques) across the entire top surface of the bottom nozzle wall 50. Their magnetic field lines correspond to the field line 72a illustrated in FIG. 4.

Insulation 73 may be placed on the upper surfaces of the chamber on the ceiling 44 and the outer surface of the nozzle cylindrical side wall 52.

The wafer 46 is supported by an RF electrode 74 (of the type disclosed in the above-referenced commonly-assigned application) to within about 2 inches (5 cm) of the bottom wall 50 of the nozzle. This feature assures preferential distribution of the incoming gas toward the wafer 40 assuring superior performance as a CVD reactor.

The RF sputtering performed by reactor of FIG. 4 suffers from a tendency of the plasma to concentrate in the peripheral annular region 76, leaving less plasma over the center of the wafer 40. This reduces the RF sputter etch rate at the wafer center. Thus, while the reactor of FIG. 4 performs CVD to great advantage, it is not as useful for performing simultaneous CVD—sputter etch processes with competing etch and deposition rates nor is it useful for sputter etch processes using oxygen chemistry. However, this embodiment is useful for any inductively coupled or inductively enhanced CVD deposition process where some compromise in plasma (ion) density uniformity over the wafer surface is acceptable.

Figure 5:
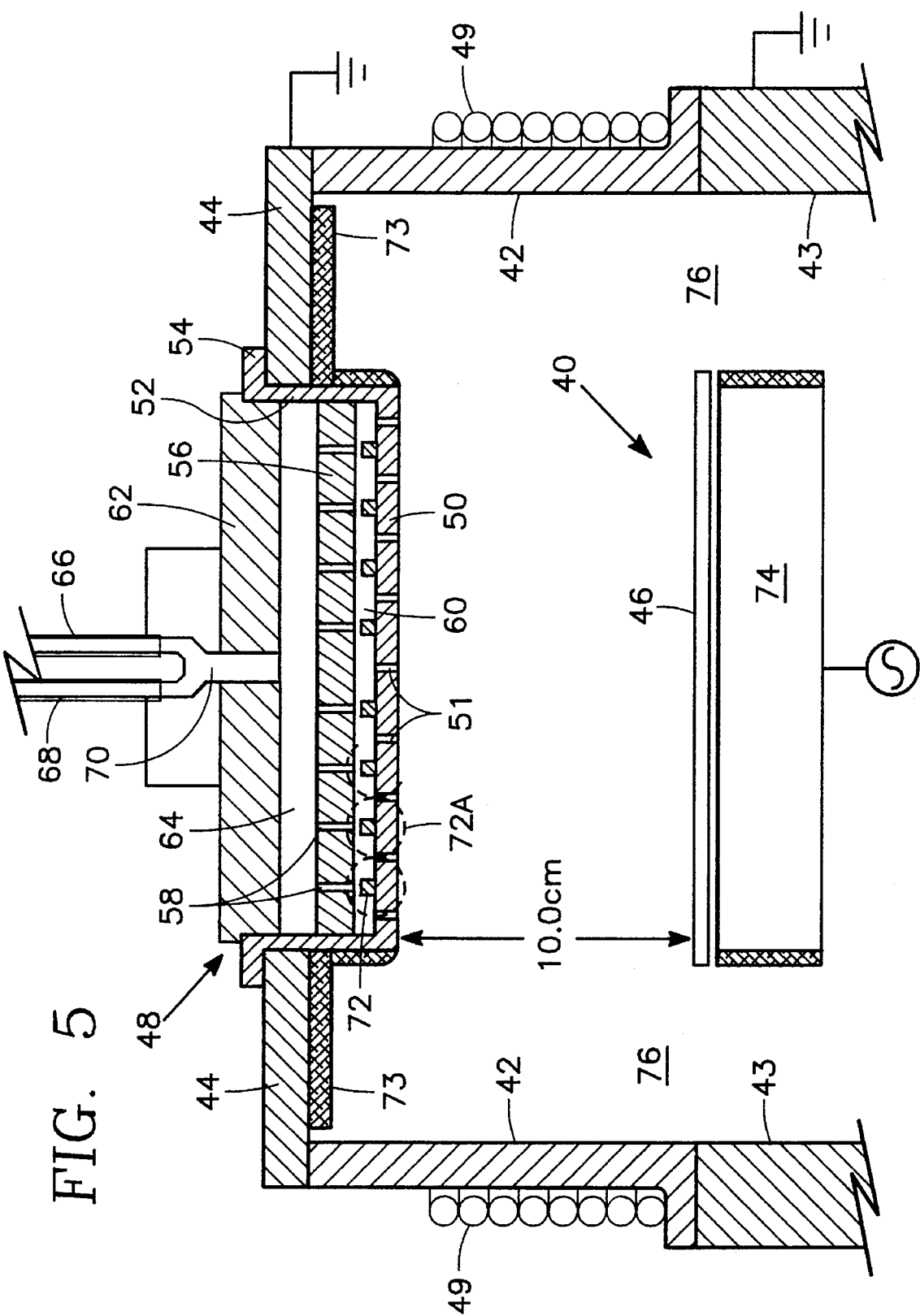
FIG. 5 is a cross-sectional elevational view of a second embodiment of the present invention employing a showerhead gas distribution apparatus.

One technique for solving the problem of plasma concentration in the peripheral annulus 76 is to raise the ceiling 44, as illustrated in FIG. 5, to about 4 inches (10 cm) or more. While this does improve the uniformity of plasma distribution, it so increases the chamber volume and diffusion distance to the wafer as to remove the advantage of a small volume chamber. Thus, there would seem to be nothing further to be gained by this approach.

Figure 1A:
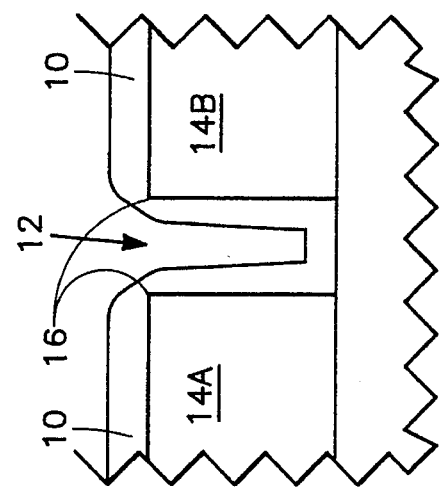
FIG. 1A is a simplified diagram illustrating problems encountered in depositing material on small microelectronic features having relatively high aspect ratios.
Figure 1B:
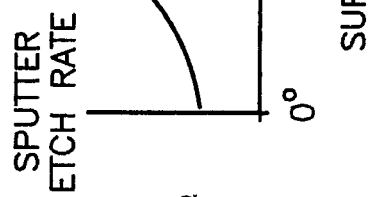
FIG. 1B is a graph illustrating the affect of surface angle on sputter etch rate.
Figure 1C:
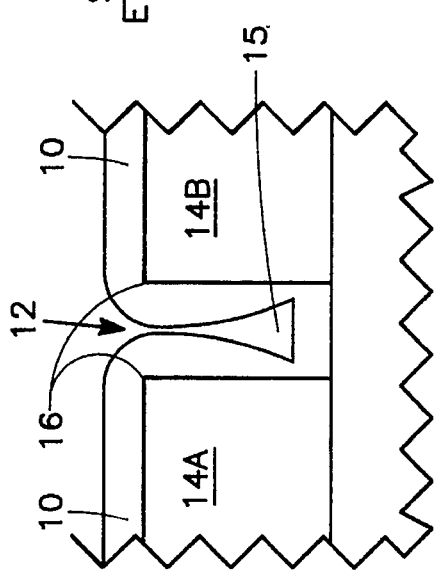
FIG. 1C is a simplified diagram corresponding to FIG. 1A showing a desired deposition pattern achieved using simultaneous CVD and sputter etch processes.
Figure 6:
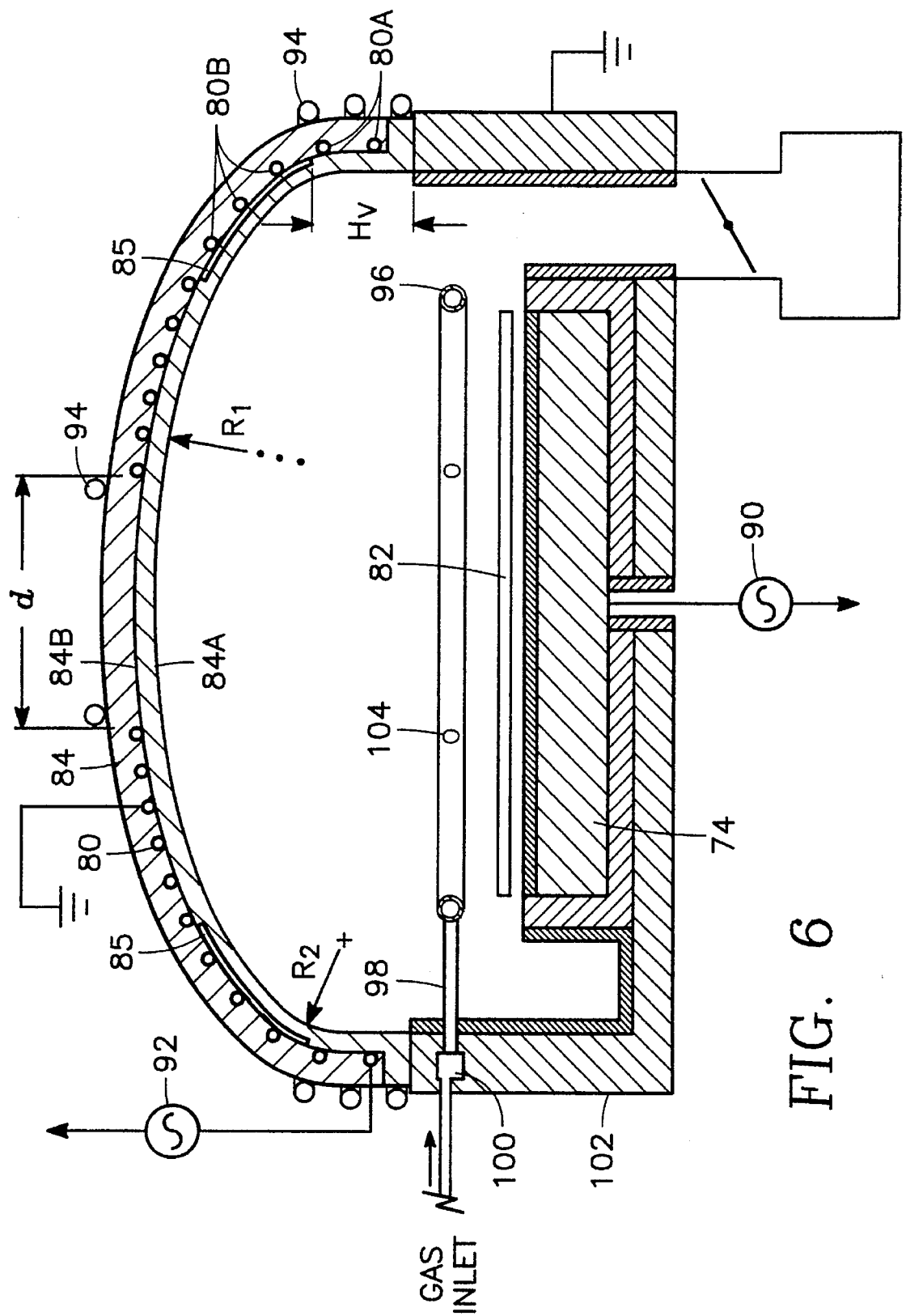
FIG. 6 is a cross-sectional elevational view of a third embodiment of the present invention employing an overhead dome-shaped RF antenna and a ring gas distribution apparatus.

The seemingly intractable problem of non-uniform distribution of oxygen ions at higher (1–30 milliTorr) vacuums is solved in the embodiment of FIG. 6. The solution is to configure the coiled RF antenna over the wafer in such a manner that all portions of the wafer are more evenly spaced from the total plasma source region adjacent the coil and chamber wall. As a result, the flux of ionic and atomic oxygen is more uniform across the wafer such that the etch rate over corner features 16 (FIG. 1A) is uniform across the wafer. As shown in FIG. 6, this is accomplished by configuring the coiled antenna 80 in a dome shape overlying and centered on the wafer 82, as well as configuring the ceiling 84 of the vacuum chamber itself in the same dome shape so that it can support the antenna 80. As before, the antenna 80 is a coiled conductor.

An advantage facilitated by the dome-shaped ceiling 84 and coiled antenna 80 of FIG. 6 is that the region adjacent the ceiling 84 of greatest ion concentration extends over a portion of the surface of the wafer 82, thus reducing the path length to the wafer center and thereby increasing the oxygen ion density at the wafer center. By contrast, in the apparatus of FIG. 2, the region of greatest ion concentration is generally vertical in extent and therefore does not overlie any portion of the wafer and is nearest only the wafer edge.

Figure 2:
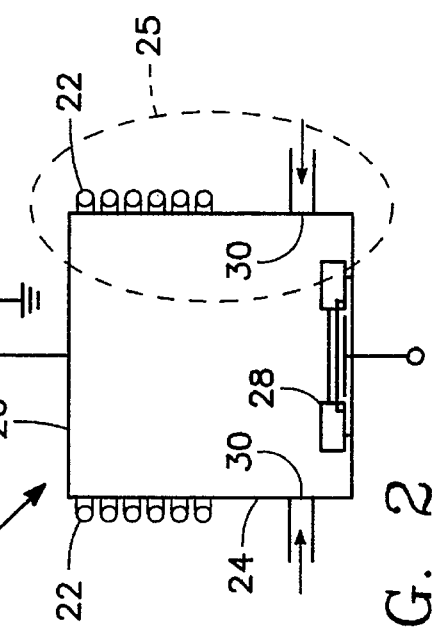
FIG. 2 is a simplified diagram of a CVD-RF plasma etch apparatus disclosed in a related application.
Figure 3:
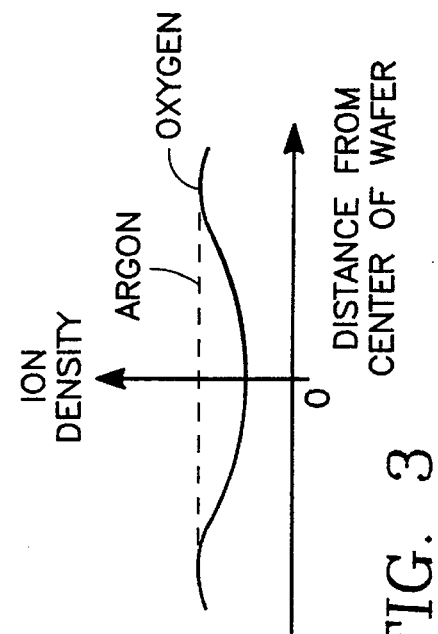
FIG. 3 is a graph illustrating the effect of distance from the wafer center on the ion density for argon and oxygen characteristic of the apparatus of FIG. 2.

In order to promote inductive coupling, the dome-shaped coiled antenna 80 includes a straight vertical cylindrical portion 80a corresponding to the simple vertical solenoid antenna coil 22 of FIG. 2 and providing the closed magnetic field lines like the magnetic field lines 25 of FIG. 2 associated with inductively coupled plasmas. The curved portion 80b of the dome-shaped coiled antenna 80 brings the region of maximum ion density closer to the wafer center, in accordance with the feature thereof described above. Preferably, the curved portion 80b has an axial length greater than 20% of the diameter of the cylindrical portion 80a. For example, in a preferred embodiment, the overall vertical extent of the coiled antenna 80 is about 9 cm, which is greater than 20% of the coil diameter or diameter of the cylindrical portion 80a.

The horizontal projection of the antenna 80 is a spiral having a center void. The center void preferably has a diameter d of from 2 to 8 inches (50 to 200 mm) for an 8-inch wafer in a chamber having a total diameter of slightly less than about 14 inches (35 cm). That is, the void preferably is 25% to 100% of the wafer diameter. This void allows a magnetic field to funnel therethrough and is preferred to suppress capacitive coupling and promote the inductive coupling of the RF energy into the plasma, thereby maintaining the low electron energies and high plasma ion density characteristic of inductively coupled plasmas.

The number of windings in each of the two portions 80a, 80b of the coiled antenna 80 is determined by the spacing between coil winds, the shape of the dome ceiling 84 (including the height $H_v$ of the vertical portion thereof) and the void diameter d. The preferred coil spacing is between ¼ inch and ⅜ inch (0.63 cm and 0.94 cm). Alternatively, the coil spacing may be on the order of a conductor width or less. The void diameter d has been defined in the previous paragraph as being between 25% and 100% of the wafer diameter. The smooth convex shape of the dome ceiling 84 currently employed is dictated by the use of the dome-shaped floor of a type 510 General Electric fused quartz crucible, General Electric part number 14111F, as the quartz ceiling layer 84a, having a major dome radius $R_1$ of 15 inch (37.5 cm) and a corner radius $R_2$ of 35 inch (8.75 cm) and an outside diameter of 14 inch (3.5 cm). Most of the long vertical cylindrical portion of the GE crucible is removed, leaving a shortened vertical height $H_v$ of about ¼ inch (0.63 cm). The distance between the wafer surface and the bottom (outer edge) of the dome ceiling 84 is about 1.5 inch (3.75 cm) while the distance between the wafer surface and the top (apex) of the dome ceiling is about 4.9 inch (12.25 cm). Preferably, the wafer height is below the lowest coil of the antenna 80.

The skilled worker can adjust the dome or spherical shape of the coiled antenna 80 as desired for optimum uniformity of RF energy across the wafer surface given the wafer size and dome height, so that the invention may be implemented with different dome shapes. In general, the dome shape is a shell of revolution whose shape maximizes the ability of the dome to withstand mechanical stress caused by the external atmospheric pressure. This shape provides maximum mechanical strength between the vacuum and atmosphere. The shape described above is a special case of a shape having a plurality of sections of differing radii that are smoothly joined, that is, have equal first derivatives at the joints between them and at the joint with the cylindrical portion. Indeed, the curvature may continuously increase from the dome top to the cylinder. Other smoothly varying shapes can be used, but a conical shape is disadvantageous because of its poor mechanical strength and the distorted electromagnetic fields produced at the sharp joint with the cylindrical portion.

The dome height is preferably greater than half and not much more than 2 times the wafer diameter and preferably is approximately equal to the wafer diameter. The skilled worker can readily determine an optimum spacing (other than that disclosed above) between adjacent conductors of the coiled antenna 80 as a function of height or position on the dome for uniformity of RF energy across the wafer surface. As disclosed in the above-referenced patent application, the conductor length of the antenna 80 is one-quarter of the wavelength of the RF signal employed to generate the plasma. In the presently preferred embodiment, the length of the antenna conductor is about 7 to 11 feet (2.1 m to 3.4 m). RF generating and tuning circuitry of the type disclosed in U.S. patent application Ser. No. 07/975,355 filed Nov. 12, 1992 by Collins et al. and assigned to the present assignee are connected to the antenna 80 and may be employed to adjust the impedance of the antenna in accordance with a desired RF frequency.

The details of construction of the embodiment of FIG. 6 correspond largely to the disclosure of the above-referenced patent application. In the preferred embodiment, the interior layer 84a is the GE quartz crucible described above which can withstand the high plasma temperatures inside the chamber. The exterior cooling layer 84b (containing the coiled antenna 80) consists of a dielectric thermally conductive material such as alumina. Of course, other materials, especially dielectrics, may be substituted.

Figure 7:
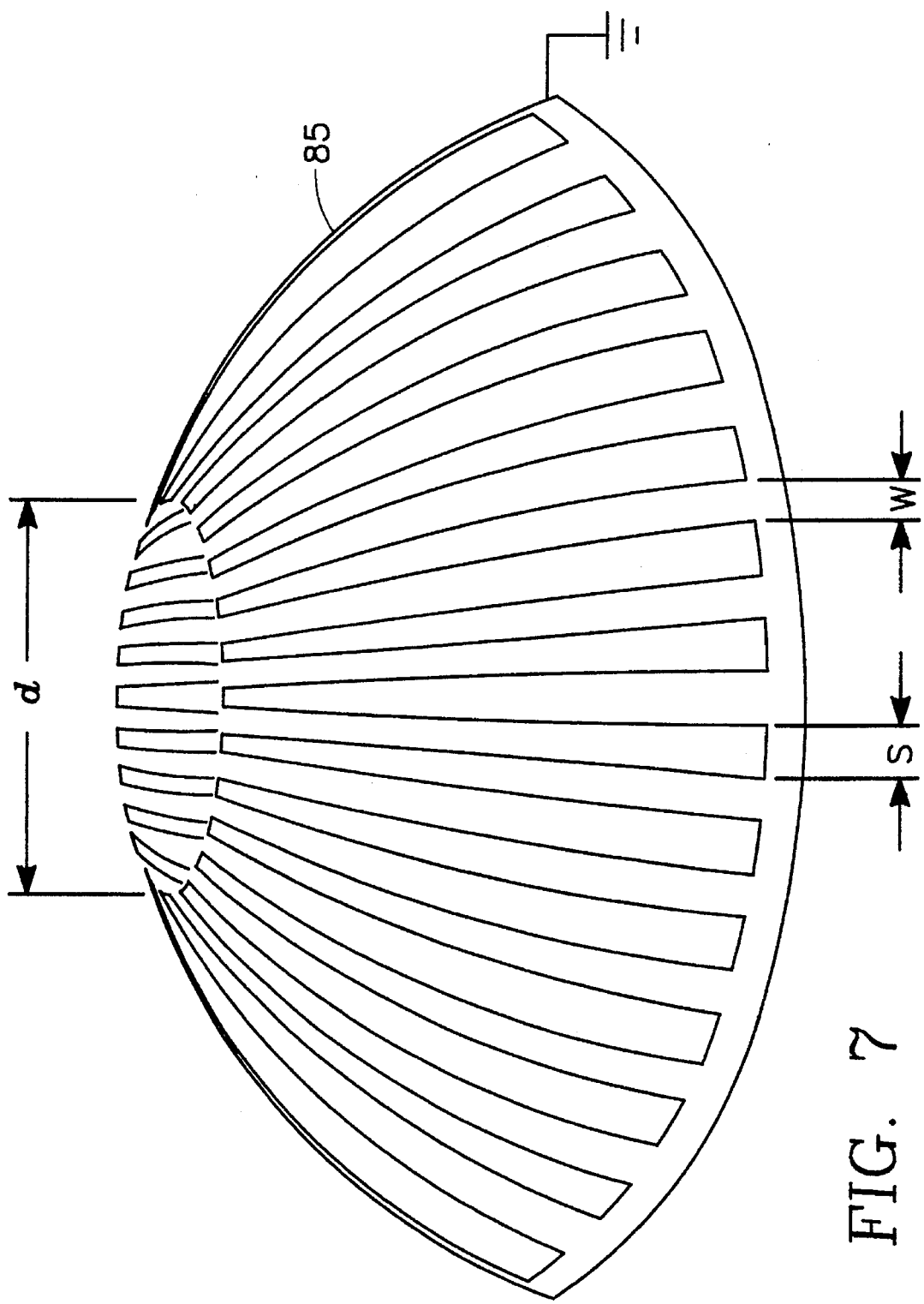
FIG. 7 is a perspective view corresponding to a portion of the domed ceiling of the embodiment of FIG. 6 and illustrating a Faraday shield preferably employed therein.

In order to suppress capacitive coupling, a grounded Faraday shield 85 having the "easter egg" configuration illustrated in FIG. 7 may be placed between the dome layers 84a, 84b between the antenna 80 and the plasma, in accordance with well-known techniques, the Faraday shield thus conforming to the dome shape of the ceiling 84 and antenna 80, including a void of diameter d. The width W of each conductive film arching strip in the shield 85 is about 1 cm and the spacing S therebetween is about 0.1 cm. As shown in the drawing, the strips are joined by a ring at the bottom but float at their tops. An RF bias electrode 74 supporting the wafer 82 is connected to an RF source 90 while one end of the conical helical antenna 80 is connected to an RF source 92. The chamber side 102 is connected to ground. Although in a tested embodiment the RF sources 90 and 92 had frequencies of 1.8 MHz and 2.0 MHz, it is expected that an industry standard frequency of 13.56 MHz will be employed. Other frequencies in the kHz to MHz range can also be used. However, frequencies above 20 MHz have been observed to introduce defects, and below 400 kHz the plasma becomes difficult to strike. The RF power applied to the antenna 80 from the RF source 92 is preferably in the range of 1000 to 3000 watts, while the RF power applied to the bias electrode from the RF source 90 is in the range of 500 to 2000 watts. Cooling is provided through coolant jackets 94.

The problem of concentrating the gas (silane) more on the wafer 80 and less on the chamber walls is solved in the embodiment of FIG. 6 by a gas ring manifold 96 fed with the gas (e.g., silane) from an inlet tube 98 connected to a gas manifold 100 in the vacuum chamber side wall 102. The ring surrounds the periphery of the wafer 80 but does not overlie the wafer 80. The advantage of the ring manifold 96 is that there are numerous spray holes 104 therein opening toward the interior of the chamber which release the silane gas very near the wafer 80 without impeding the plasma over the wafer 80.

However, the ring manifold 96 has some deleterious effect on the plasma, at least near the wafer periphery, and is subject to heating. Heating of the ring manifold 96 makes it liable to failure due to formation of amorphous silicon residues in its interior from breakdown of the silane gas flowing within it. The manifold 96 can reach temperatures as high as 500° C. at high RF power levels.

The heating problem is solved in the preferred embodiment of FIG. 8, which employs at least four (and as many as 8 or 12 or more) periodically circumferentially spaced radially inwardly-directed gas feed nozzles 106 each connected through the cylindrical chamber side wall 102 to the gas manifold 100 therein. The advantage is that the chamber wall 102 is a heat sink to the nozzles 106, its outer surface facing a cool environment, holding the temperature of the nozzles 106 well-below that at which silane tends to break down to form amorphous silicon. Another advantage of the embodiment of FIG. 8 is that the nozzles present a far smaller cross-section to the plasma than does the ring manifold 96 of FIG. 6, and therefore little loss of the plasma density occurs. The nozzles 106 introduce the silane while any gas distribution device of the type disclosed in the above-referenced patent application suffices to introduce oxygen, argon or other gases into the vacuum chamber.

In order to minimize any impedance between the plasma and the wafer, the nozzles 106 of FIG. 8, like the ring manifold 96 of FIG. 6, extend close to but not over the wafer 82.

Further preference in the distribution of the silane gas towards the wafer 82 is achieved by maintaining supersonic gas flow through the exit ports of the nozzles 106. This is accomplished by using a very small nozzle orifice (preferably on the order of 10 mils) and maintaining a large pressure differential between the inside and outside of the nozzle 106 for a given gas flow and a given number of nozzles. As illustrated, the nozzle tip has an inner portion sharply tapering radially inwardly and an outer portion gradually tapering radially outwardly. A sapphire sleeve within the orifice prevents clogging.

Such a pressure differential is realized by the vacuum maintained within the chamber relative to the nozzle orifice. Typically, the total flow rate through all the nozzles is in the range of 30 to 120 standard cubic centimeters per second. Such supersonic gas flow is characterized (as shown in FIG. 9) by a Mach disk 110 inboard of the wafer periphery, preferably by a few centimeters. The Mach disk 110 is an imaginary boundary behind which no silane diffuses back directly toward the nozzle 106. The result is that the effective center of diffusion 112 of the silane gas is several centimeters (about 3 cm in one implementation) inboard of the wafer periphery rather than being at the tip of the nozzle, a significant advantage. Provided the vacuum pressure inside the chamber is less than about 30 milliTorr, the silane distribution from the diffusion centers 112 is uniform across the wafer surface.

Supersonic gas flow can also be achieved in the ring manifold 96 of FIG. 6 by the same step of maintaining a sufficient pressure differential between the interior of the gas manifold 96 and the interior of the vacuum chamber. With such supersonic gas flow, the ring manifold 96 may be enlarged so as to not be near the heat-inducing plasma.

A cross-sectional side view of a preferred nozzle 106 is illustrated in FIG. 9. The shape of the nozzle tip is important to minimize the deposition on the nozzle itself. In order to achieve a 3% uniformity of deposition and sputter etch rates across an 8-inch wafer surface, more than eight periodically spaced nozzles 106 are preferably employed in the embodiment of FIG. 8.

The plasma reactors of the embodiments of FIGS. 6 and 8 are useful in performing any CVD thin film deposition. The nozzle gas distribution described above is especially useful for any deposition of films using highly reactive chemical precursor species such as silane. The reactor can be used for films other than silicon dioxide, such as, for example, diamond. Moreover deposition of material having a high dielectric constant can be carried out as well by these embodiments.

Figure 10:
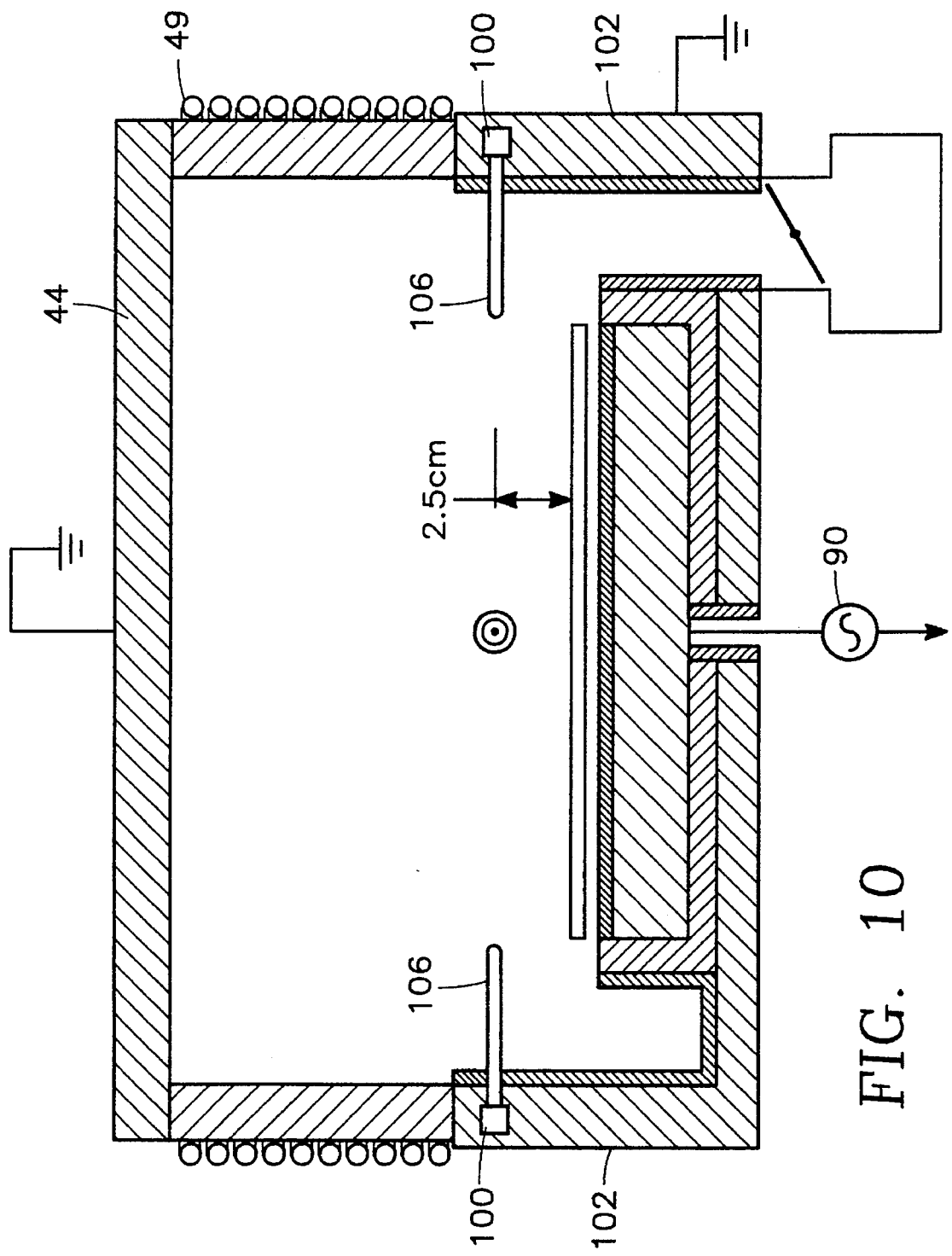
FIG. 10 is a cross-sectional elevational view of a fifth embodiment of the present invention employing a cylindrical antenna, a flat ceiling and a multiple nozzle gas distribution apparatus.

FIG. 10 illustrates how the silane nozzles may be combined with the cylindrical antenna design discussed previously in connection with FIG. 4. As in the embodiments of FIGS. 2, 4 and 5, the chamber walls in the embodiment of FIG. 10, including the metal ceiling 44, are electrically grounded. The nozzles of the invention can be advantageously used in any plasma reactor, including RF and DC capacitively coupled reactors.

Figure 11:
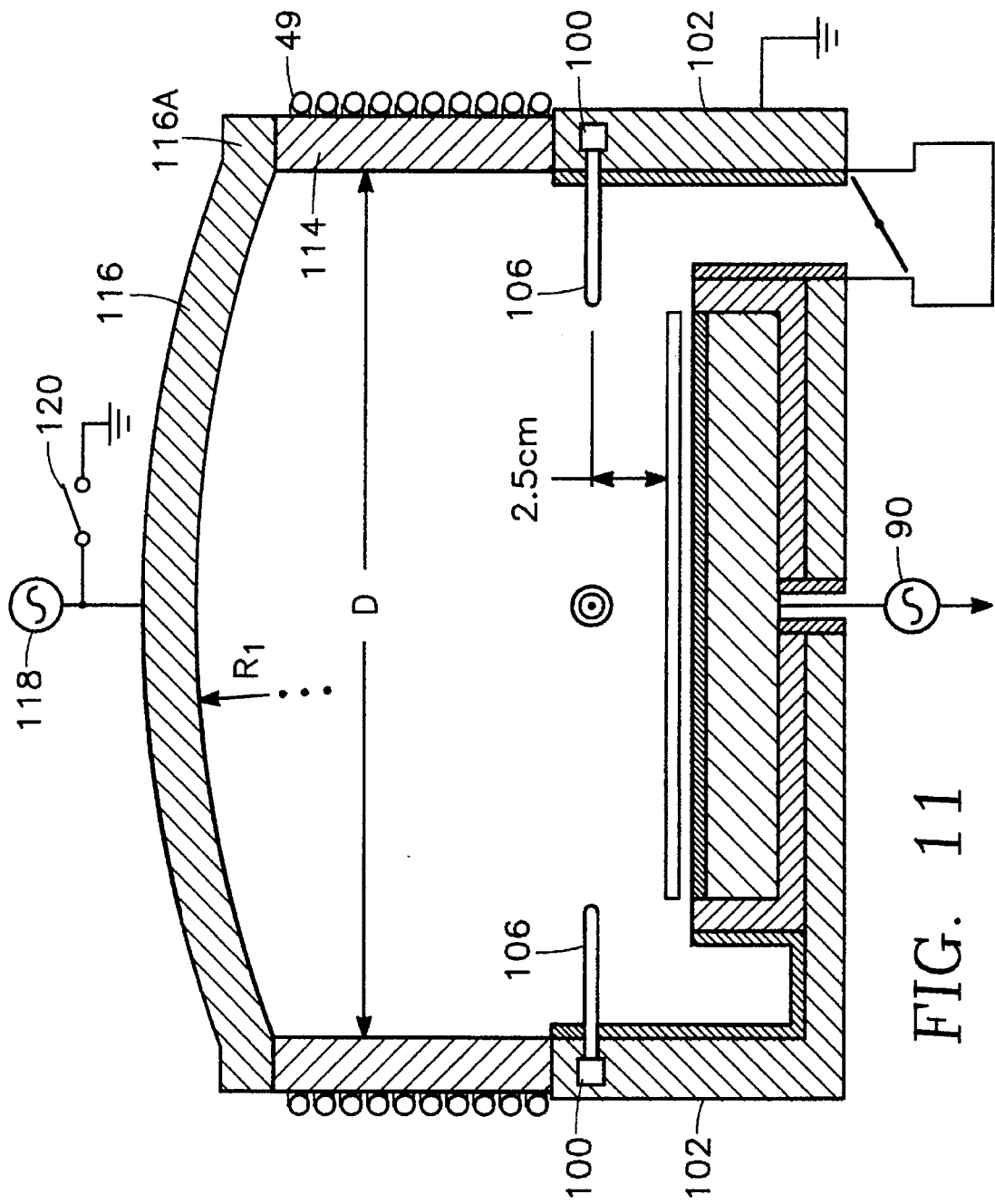
FIG. 11 is a cross-sectional elevational view of a sixth embodiment of the present invention employing a cylindrical antenna, a multiple nozzle gas distribution apparatus and a domed conductive ceiling.

The embodiment of FIG. 10 may be improved by replacing the flat conductive ceiling 44 of FIG. 10 with a dome-shaped conductive ceiling 116 illustrated in FIG. 11. The shape of the dome-shaped conductive ceiling 116 of FIG. 11 generally corresponds to the dome-shaped dielectric ceiling of the preferred embodiments of FIGS. 6 and 8 and provides similar benefits in more uniformly distributing the ion concentration over the wafer center. Specifically, the dome-shaped conductive ceiling 116 provides an electrical ground reference plane to the plasma which enhances sputter etch rate. The ground plane provided by the dome-shaped ceiling 116 is further away from the wafer surface at the wafer center than at the wafer edges so as to enhance ion density near the wafer center by providing more volume for ion diffusion to even out non-uniformites, thereby increasing ion density uniformity across the wafer surface. Preferably, the dome-shaped conductive ceiling 116 of FIG. 11 has a major radius $R_1$ of 10.42 inch (26.05 cm) and a horizontal diameter D of 12.25 inch (30.6 cm). The dome-shaped ceiling 116 is supported by shoulders 116a resting on the vertical vacuum chamber wall 114 so that the top of the dome ceiling 116 rises about 5 inches (12.5 cm) above the wafer, similarly to the embodiment of FIG. 6. As in the embodiment of FIG. 10, the dome-shaped conductive ceiling 116 is electrically grounded. One advantage of the embodiment of FIG. 11 is that a sputter etch process having a uniformity across the wafer surface similar to that achieved in the embodiments of FIGS. 6 and 8 can be obtained using the cylindrical RF antenna coil configuration employed in the embodiments of FIGS. 4 and 5.

An additional advantage of the embodiment of FIG. 11 is that the conductive ceiling 116 can be connected to an RF power source 118 and disconnected from ground by a switch 120 to facilitate cleaning of the vacuum chamber using a conventional fluorine etch cleaning process. Powering the conductive ceiling 116 with a bias RF field during an in-situ chamber clean enhances the cleaning rate and efficiency of the cleaning process in removing contamination from the chamber walls and ceiling 116.

Figure 12:
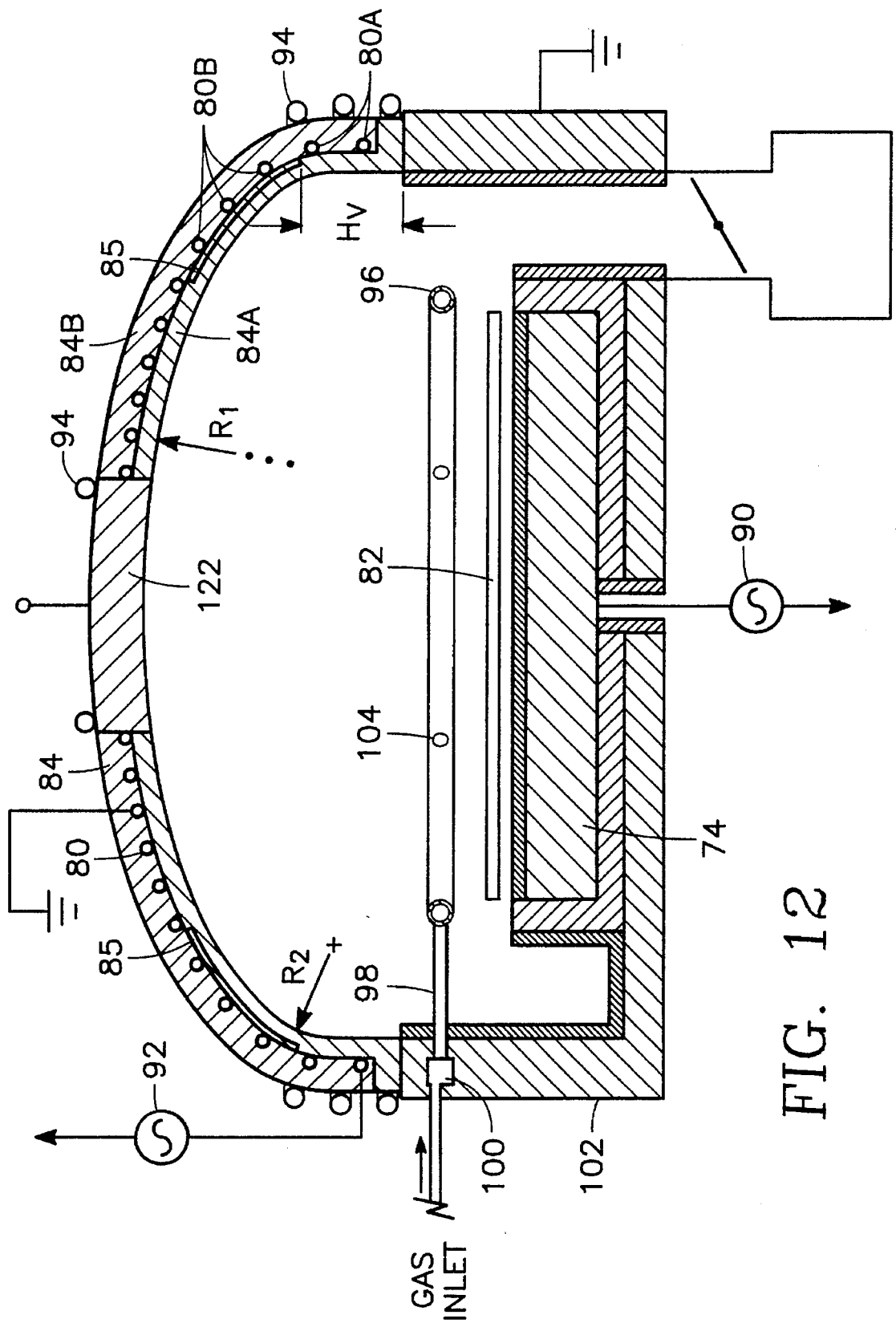
FIG. 12 is a cross-sectional elevational view of a seventh embodiment of the present invention corresponding to a combination of features of the embodiments of FIGS. 6 and 11.

Features of the embodiments of FIGS. 6 and 11 can be advantageously combined as illustrated in FIG. 12. A top central dome-shaped electrode 122 is placed within the central void of the spiral antenna 80. It is electrically isolated from the spiral antenna 80 and is held between the dielectric layers 84a, 84b of the ceiling 84. The top electrode 122 can be advantageously used for chamber cleaning when it is connected to an RF source. For operation as a cleaning electrode, it should have a diameter less than that of the pedestal. During normal CVD operations, the top electrode 122 can be left floating, be grounded or be otherwise electrically controlled.

While preferred embodiments of the invention have been described with reference to sputter etching employing electronegative ions such as oxygen ions, other species may be employed such as fluorine. If chlorine is employed for sputter etching, then materials other than aluminum for the chamber walls may be substituted to avoid damage thereto from chlorine ions.

Although the invention is particularly useful for a CVD process using an inductively coupled RF plasma and oxygen sputtering, it is not so limited. The dome-shaped coil can be applied to etching processes and to processes using other processing gases such as the halogen-containing fluorocarbons, for example. The inventive nozzles can be applied to almost any type of plasma processing chamber, whether for CVD, etching or physical vapor deposition.

While the invention has been described in detail by specific reference to preferred embodiments, it is understood that variations and modifications thereof may be made without departing from the true spirit and scope of the invention.

What is claimed is:

1. An RF inductively coupled plasma reactor for the processing of a wafer, said reactor comprising:
   a vacuum chamber;
   one or more gas sources for introducing into said chamber reactant gases;
   an antenna capable of radiating RF energy into said chamber to generate a plasma therein by inductive coupling, said antenna comprising a substantially domed-shaped portion at least partially surrounding said plasma and a vertical cylindrical portion which underlies said substantially domed-shaped portion.

2. The reactor of claim 1 wherein a concave surface of said antenna is facing and symmetrically disposed relative to the top surface of said wafer.

3. The reactor of claim 1 wherein an axial height of the dome-shaped portion of the antenna is not less than 20% of the diameter of said vertical cylindrical portion.

4. The reactor of claim 3 wherein said vacuum chamber comprises a ceiling comprising a vertical cylindrical portion and an overlying dome-shaped portion corresponding respectively to the shapes of said vertical cylindrical and dome-shaped portions of said antenna and wherein said antenna comprises an elongate conductor embedded within said ceiling and coiled around a rotational axis of symmetry of said ceiling.

5. The reactor of claim 4 wherein said ceiling comprises a plurality of ceiling sections having decreasing radii of curvature from a top of said ceiling and being smoothly joined to each other.

6. The reactor of claim 1, wherein said substantially dome-shaped portion of the antenna has a circular void centered at the apex thereof.

7. The reactor of claim 6 wherein said void has a diameter on the order of between 25% and 100% of the diameter of said wafer.

8. The reactor of claim 6 further comprising:
   an electrode insulated from said antenna and disposed in said void, said electrode being connectable to an electrical source.

9. The reactor of claim 8 wherein said electrode is connectable to an RF source during cleaning of said chamber.

10. The reactor of claim 4 wherein said coiled conductor has a length corresponding to a quarter wavelength of an RF signal applied to said antenna.

11. The reactor of claim 10 wherein said RF signal has an RF frequency between 400 kHz and 20 MHz.

12. The reactor of claim 1 wherein at least one of said reactant gases contributes both (a) ions to said plasma for sputter etching and (b) chemical species for chemical vapor deposition, and wherein plasma ion density across said wafer is sufficient so that the rate of said sputter etching on surfaces of the wafer which are not substantially one of (I) parallel, or (ii) perpendicular to an angle of incidence of the ions on the wafer is at least on the order of the rate of said chemical vapor deposition.

13. The reactor of claim 1 wherein at least one gas source comprises:
   a plurality of elongate spray nozzles located within and thermally coupled to a vacuum containment wall of said vacuum chamber and extending toward said wafer with respective nozzle tips near the edge of said wafer.

14. The reactor of claim 13 wherein gas flow out of said nozzles is supersonic.

15. The reactor of claim 1 wherein at least one gas source comprises:
   a closed tube inside said vacuum chamber and symmetrically disposed relative to said wafer and following an edge contour of said wafer so as to not overlie a substantial portion of said wafer, said closed tube having a plurality of spray openings therein facing an interior portion of said vacuum chamber overlying said wafer.

16. A plasma reactor including means for holding a wafer in a vacuum chamber, comprising:
   an antenna capable of radiating RF energy into said chamber to generate a plasma in a portion of said chamber overlying said wafer; and
   means for spraying a reactant gas at a supersonic velocity toward said portion of said chamber overlying said wafer, so as to produce a substantially uniform distribution of the reactant gas in said portion of the chamber.

17. The reactor of claim 16 wherein said means for supersonically spraying comprises a plurality of elongate supersonic spray nozzles.

18. The reactor of claim 17 wherein each one of said nozzles has an inner portion tapering radially inwardly and an outer portion tapering radially outwardly.

19. The reactor of claim 17 wherein said nozzles extend toward said wafer with respective nozzle tips having gas distribution inlet orifices up to but not overlying the edge of said wafer.

20. The reactor of claim 19 wherein said spray nozzles are thermally coupled to a vacuum containment wall of said vacuum chamber.

21. The reactor of claim 19 wherein supersonic gas flow from each nozzle forms an gas diffusion center displaced from the nozzle tip thereof to a location overlying said wafer.

22. The reactor of claim 19 wherein said orifices each have a size on the order of 10 mils and said chamber has a vacuum between 1 and 30 milliTorr.

23. A plasma reactor including means for holding a wafer in a vacuum chamber, comprising:
   an antenna capable of radiating RF energy into said chamber to generate a plasma in a portion of said chamber overlying said wafer;
   a plurality of elongate spray nozzles thermally coupled to a vacuum containment wall of said vacuum chamber and extending away from said containment wall toward said wafer such that a distal end of each of said spray nozzles is disposed no closer to the wafer than an edge thereof, each spray nozzle comprising a nozzle tip having a gas distribution orifice at the distal end.

24. A plasma reactor including means for holding a wafer in a vacuum chamber, comprising:
   an antenna capable of radiating RF energy into said chamber to generate a plasma in a portion of said chamber overlying said wafer, said antenna comprising a substantially domed-shaped portion at least partially surrounding said plasma and a vertical cylindrical portion which underlies said substantially domed-shaped portion; and,
   a closed tube inside said vacuum chamber for spraying a reactant gas into said portion of said chamber overlying said wafer and symmetrically disposed relative to said wafer and following an edge contour of said wafer so as to not overlie a substantial portion of said wafer, said closed tube having a plurality of spray openings therein facing an interior portion of said vacuum chamber overlying said wafer.

25. A plasma reactor including means for holding a wafer in a vacuum chamber, comprising:
   an antenna capable of radiating RF energy into said chamber to generate a plasma in a portion of said chamber overlying said wafer;
   a planar spray showerhead for spraying a reactant gas into said portion of said chamber overlying said wafer, said planar spray showerhead overlying an interior portion of said vacuum chamber over said wafer and having plural spray nozzle openings facing said wafer; and
   plural magnets in an interior portion of said planar spray showerhead between adjacent ones of said plural nozzle openings, said plural magnets being oriented so as to repel ions from said spray nozzle openings.

26. The reactor of claim 25 wherein said nozzle openings are located in a range of about 25% to 50% of a wafer diameter from said wafer.

27. A plasma reactor including means for holding a wafer in a vacuum chamber for containing a processing gas, comprising:
   an antenna capable of radiating RF energy into said chamber to generate a plasma, said antenna comprising a substantially domed-shaped portion at least partially surrounding said plasma and a vertical cylindrical portion which underlies said substantially domed-shaped portion; and,
   a conductive dome-shaped electrode insulated from said antenna and overlying said wafer and being connectable to an electrical potential.

28. The reactor of claim 27 wherein said dome-shaped electrode comprises a portion of a ceiling of said chamber and is connected to ground during processing.

29. The reactor of claim 28 further comprising means for connecting said dome-shaped electrode to an RF power source during cleaning of said chamber.

30. A plasma process, comprising the steps of:
   providing a vacuum processing chamber holding a workpiece to be processed and having on one side thereof an antenna comprising a substantially dome-shaped portion at least partially surrounding a plasma generating region and a vertical cylindrical portion which underlies said substantially domed-shaped portion;
   feeding a processing gas including an electronegative gas into said processing chamber;
   resonantly coupling an RF electrical signal to said antenna;
   non-resonantly and inductively coupling electromagnetic energy from said antenna into a plasma formed in said plasma generating region of said processing chamber from said processing gas, whereby said workpiece is processed by said plasma.

31. The plasma process of claim 30, wherein said electronegative gas comprises oxygen gas.

32. The plasma process of claim 30 wherein said electronegative gas comprises a halogen.

33. The plasma process of claim 31, wherein said processing gas additionally comprises a precursor gas for silicon oxide.

34. The plasma process of claim 1, wherein said RF electrical signal has a frequency within the range of 400 kHz to 20 MHz.

35. The plasma process of claim 34, wherein a pressure of said processing gas within said chamber is within a range of 1 to 30 milliTorr.

36. The reactor of claim 1 further comprising:
   means for suppressing a capacitive coupling of the RF energy radiating from the antenna into the chamber.

37. The reactor of claim 36 wherein said suppressing means comprises:
   a grounded Faraday shield disposed between the antenna and the plasma generated inside the vacuum chamber, said shield suppressing capacitive coupling between the antenna and the plasma.

38. The reactor of claim 37 wherein the shield comprises a dome-shaped shield corresponding to the shape of the antenna.

39. The reactor of claim 38 wherein the shield comprises:
   a ring comprising a conductive film strip and forming a bottom of the dome-shaped shield, said ring positioned so as to be between a bottom portion of the antenna and the plasma; and,
   a plurality of conductive film strips, individual ones of which project periodically from the ring along a circumference thereof in a perpendicular direction and forming a top portion of the dome-shaped shield.

40. The reactor of claim 39 wherein each of the plurality of conductive film strips projecting from the ring is approximately 1 cm in width, and wherein a spacing between each of the plurality of strips along the circumference of the ring is approximately 0.1 cm.

41. The reactor of claim 1 wherein said vacuum chamber comprises a dome-shaped ceiling corresponding to the shape of the antenna.

42. The reactor of claim 41 wherein the dome-shaped ceiling comprises a heat-resistant interior layer and an exterior cooling layer.

43. The reactor of claim 42 wherein said antenna comprises an elongate conductor embedded within said exterior cooling layer and coiled around a rotational axis of symmetry of said ceiling.

44. The reactor of claim 41 wherein the heat resistant interior layer comprises quartz and the exterior cooling layer comprises a dielectric thermally conductive material.

45. A plasma reactor including means for holding a wafer in a vacuum chamber for containing a processing gas, comprising:

> an antenna capable of radiating RF energy into said chamber to generate a plasma comprising ions; and
>
> a ceiling overlying the wafer comprising at least two ceiling sections having decreasing radii of curvature from a top of the ceiling and being smoothly joined to each other thereby imparting a dome-shape to the ceiling, wherein the ceiling is further away from a center of the wafer than edges of the wafer so as to enhance a density of the plasma over the center of the wafer by providing more volume for diffusion of ions within the plasma thereby providing for a uniform distribution of ions throughout the plasma; and wherein,
>
> the ceiling is conductive and is connectable to ground during a sputter etching of the wafer so as to increase a rate of sputter etching.

46. The plasma reactor of claim 45 wherein the ceiling is further connectable to a RF power source during cleaning of the vacuum chamber.

47. An RF inductively coupled plasma reactor including means for holding a wafer in a vacuum chamber, said reactor comprising:

> one or more gas sources for introducing into said chamber reactant gases;
>
> an antenna capable of radiating RF energy into said chamber to generate a plasma therein by inductive coupling, said antenna comprising a substantially domed-shaped portion at least partially surrounding said plasma and a circular void centered at the apex of the domed-shaped portion, said. circular void further having a diameter in excess of 33% of the diameter of said wafer; and > an electrode insulated from said antenna and disposed in said void, said electrode being connectable to an electrical source.

48. The reactor of claim 47 wherein said electrode is connectable to an RF source during cleaning of said chamber.

49. An RF inductively coupled plasma reactor including means for holding a wafer in a vacuum chamber, said reactor comprising:

> one or more gas sources for introducing into said chamber reactant gases;
>
> an antenna capable of radiating RF energy into said chamber to generate a plasma therein by inductive coupling, said antenna comprising a substantially domed-shaped portion at least partially surrounding said plasma and a vertical cylindrical portion which underlies said substantially domed-shaped portion; and,
>
> a grounded Faraday shield disposed between the antenna and the plasma generated inside the vacuum chamber, said shield suppressing capacitive coupling between the antenna and the plasma.

50. The reactor of claim 49 wherein the shield comprises a dome-shaped shield corresponding to the shape of the antenna.

51. The reactor of claim 50 wherein the shield comprises:

> a ring comprising a conductive film strip and forming a bottom of the dome-shaped shield, said ring positioned so as to be between a bottom portion of the antenna and the plasma; and,
>
> a plurality of conductive film strips, individual ones of which project periodically from the ring along a circumference thereof in a perpendicular direction and forming a top portion of the dome-shaped shield.

52. The reactor of claim 51 wherein each of the plurality of conductive film strips projecting from the ring is approximately 1 cm in width, and wherein a spacing between each of the plurality of strips along the circumference of the ring is approximately 0.1 cm.

\* \* \* \* \*